(12) United States Patent
Benedict

(10) Patent No.: US 10,522,209 B2
(45) Date of Patent: Dec. 31, 2019

(54) NON-BINARY RANK MULTIPLICATION OF MEMORY MODULE

(71) Applicant: Hewlett Packard Enterprise Development LP, Houston, TX (US)

(72) Inventor: Melvin K. Benedict, Magnolia, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 155 days.

(21) Appl. No.: 15/031,969

(22) PCT Filed: Nov. 13, 2013

(86) PCT No.: PCT/US2013/069851
§ 371 (c)(1),
(2) Date: Apr. 25, 2016

(87) PCT Pub. No.: WO2015/072983
PCT Pub. Date: May 21, 2015

(65) Prior Publication Data
US 2016/0276016 A1    Sep. 22, 2016

(51) Int. Cl.
*G11C 11/408*    (2006.01)
*G11C 8/12*    (2006.01)
(Continued)

(52) U.S. Cl.
CPC ...... *G11C 11/4082* (2013.01); *G06F 12/0623* (2013.01); *G11C 5/025* (2013.01);
(Continued)

(58) Field of Classification Search
CPC ......... G06F 12/0623; G06F 2212/2532; G11C 11/4082
See application file for complete search history.

(56) References Cited

U.S. PATENT DOCUMENTS

2010/0011165 A1*    1/2010    Rossi .................. G06F 12/0864
                                                                        711/128
2010/0262751 A1*    10/2010    Avudaiyappan .... G06F 12/0292
                                                                        711/5

(Continued)

FOREIGN PATENT DOCUMENTS

EP          2450799        5/2012
WO     WO-2012061633    5/2012

OTHER PUBLICATIONS

Fujitsu Technology Solutions; "Fujitsu Primergy Servers Memory Performance of Xeon E5-2600/4600 (Sandy Bridge-EP) Based Systems". < http://globalsp.ts.fujitsu.com/dmsp/Publications/public/wp-sandy-bridge-ep-memory-performance-ww-en.pdf Dec. 7, 2012, 19 Pages.

(Continued)

*Primary Examiner* — David Yi
*Assistant Examiner* — Leandro R Villanueva
(74) *Attorney, Agent, or Firm* — Trop, Pruner & Hu, P.C.

(57) ABSTRACT

One of a plurality of chip select inputs of a load-reduced dual inline memory module (LRDIMM) may be repurposed to an address input. One of a plurality of memory ranks of the LRDIMM may be selected based on a remainder of the plurality of chip select inputs. The repurposed chip select input may be used to support non-binary rank multiplication of the LRDIMM.

19 Claims, 3 Drawing Sheets

(51) Int. Cl.
*G06F 12/06* (2006.01)
*G11C 5/02* (2006.01)
*G11C 5/04* (2006.01)

(52) U.S. Cl.
CPC .................. *G11C 5/04* (2013.01); *G11C 8/12* (2013.01); *G06F 2212/2532* (2013.01)

(56) References Cited

U.S. PATENT DOCUMENTS

| | | |
|---|---|---|
| 2011/0138162 A1 | 6/2011 | Chiu et al. |
| 2012/0117318 A1 | 5/2012 | Burton et al. |
| 2012/0260137 A1* | 10/2012 | Berke ................ G06F 13/1673 714/721 |
| 2013/0054949 A1 | 2/2013 | Berke et al. |
| 2016/0162404 A1* | 6/2016 | Lee .................... G06F 12/0802 |

OTHER PUBLICATIONS

Intel Corporation, "Intel® Server Board S2600CO Family", < http://download.intel.com/support/motherboards/server/s2600co/sb/g42278002_s2600co_tps_r1_00.pdf > Feb. 2012, 168 Pages.
International Searching Authority, The International Search Report and the Written Opinion, dated Aug. 4, 2014. For PCT/US2013/069851, 10 Pages.

* cited by examiner

NON-BINARY RANK MULTIPLICATION OF MEMORY MODULE

CROSS-REFERENCE TO RELATED APPLICATION

Pursuant to 35 U.S.C. § 371, this application is a United States National Stage Application of International Patent Application No. PCT/US2013/069851, filed on Nov. 13, 2013, the contents of which are incorporated by reference as if set forth in their entirety herein.

BACKGROUND

Load reduced dual inline memory modules (LRDIMMs) may be a type of double date rate (DDR) memory. LRDIMMs may buffer a memory address bus and a data bus to the memory controller by adding a full memory buffer chip to the DIMM.

Unlike Fully Buffered DIMMs (FBDIMMs), LRDIMMs may deliver data to the memory controller in parallel rather than using a high-speed serial connection. Manufacturers, vendors and/or suppliers are challenged to provide users with products that incorporate LRDIMMs.

BRIEF DESCRIPTION OF THE DRAWINGS

The following detailed description references the drawings, wherein.

DETAILED DESCRIPTION

Figure 1:
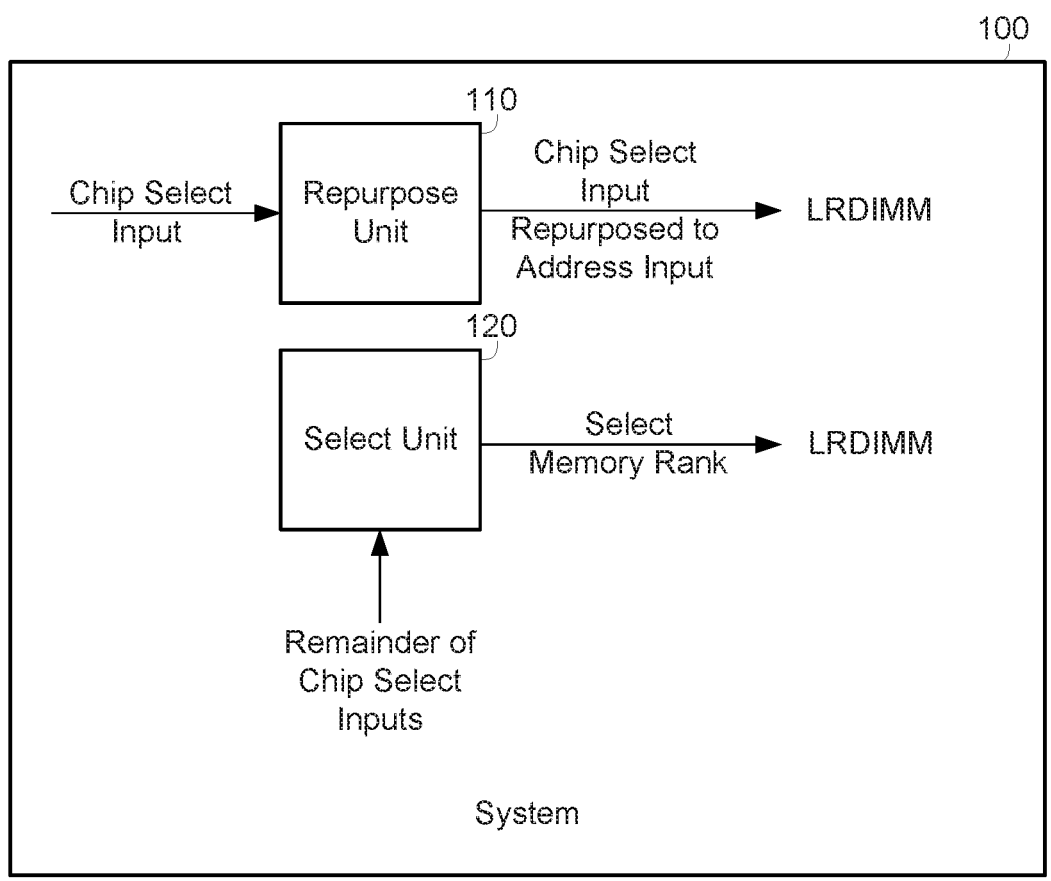
FIG. 1 is an example block diagram of a system to repurpose a chip select input to an address input.

Specific details are given in the following description to provide a thorough understanding of embodiments. However, it will be understood that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Load-Reduced dual in-line memory modules (LRDIMMs) are designed with a buffer, as opposed to a register, to reduce a load on a server memory bus while increasing overall server system memory capacity and/or speed. LRDIMMs may be useful in memory-intensive applications in data centers, cloud computing and in high-performance computing (HPC) environments. LRDIMM is pin-compatible with existing Double data rate (DDR), including DDR3 and DDR4, DIMM sockets and is JEDEC standard.

LRDIMMs may buffer the memory address bus and the data bus to the memory controller by adding a full memory buffer chip to the DIMM module. Unlike the Fully Buffered DIMMs (FBDIMMs) from DDR2 days, Load Reduced DIMMs deliver data to the memory controller in parallel rather than using a high-speed serial connection.

LRDIMMs are the first DDR3 DIMMs to support operation of three quad-ranked DIMMs on a memory channel. DDR3 memory architecture may only natively support a maximum of eight ranks per channel, not the 12 ranks required for three quad-rank DIMMs. LRDIMM architecture may solve this issue using by using a design known as rank multiplication.

With rank multiplication, a system memory controller may see each quad-rank DIMM as a dual-rank DIMM. The system controller may use normal external chip select signal to address one of the six ranks that it sees. The memory buffer chip on the selected LRDIMM may then acts as an intermediary, intercepting the external chip select signal and mapping it to one of four back-end chip select lines located on the LRDIMM module. The buffer determines the correct back-end chip select line to activate based on both the external chip select and the row and column addresses that the memory controller asserts for the given memory operation.

Thus, LRDIMMs may increase memory footprint without reduction in performance. Further, LRDIMMs may present a single load to the memory controller while logically increasing the apparent storage capability by presenting to the controller a storage element which appears to be a multiple of the largest dynamic random access memory (DRAM) available (rank multiplication).

A memory subsystem may be a significant portion of platform, cost, power, and performance. Memory components typically are organized in powers of 2. Hence, these components generally double in size with nearly each generation. As a result, the increments of available memory components may be larger when compared to an actual need or ability for additional memory of a consumer. The doubling of capacity in each succeeding generation has progressed to the point where the capacity size differences between products is such that customers are looking for products with 1.5× step over the traditional 2× progression.

Examples may provide a mechanism for non-binary rank multiplication of the LRDIMM. An example device may include a repurpose unit and a select unit. The repurpose unit may repurpose one of a plurality of chip select inputs of a load-reduced dual inline memory module (LRDIMM) to an address input. The select unit may select one of a plurality of memory ranks of the LRDIMM based on a remainder of the plurality of chip select inputs. The repurposed chip select input may be used to support non-binary rank multiplication of the LRDIMM.

Thus, examples may allow vendors or manufacturers to provide customers with cost effective products which meets need their needs, such as by developing unique memory subsystems based upon industry standard components, e.g. non-binary rank LRDIMMS. For instance, Systems that only have 2 DIMM slots per channel may greater volume constraints than systems with 3 DIMM slots per channel, yet a similar increase in the memory footprint may still be desired. By increasing rank count in a non-binary manner, examples may be able to have a rank counts on platforms with 2 DIMM slots per channel equal to rank counts on system with 3 DIMM slots per channel.

For example, assume a first system with 3 LRDIMM slots per channel cannot support three 32 Gigabyte (GB) LRDIMMs due to the system's bandwidth constraints per memory channel. However, the first system may support up to support three 16 GB LRDIMMs (such as at an operation speed of 1333 Megahertz (MHz)), for total memory capacity of 48 GB per channel.

Now assume a second system has similar bandwidth constraints but only 2 LRDIMM slots per channel. Normally, such a system would only be able to support two 16 GB LRDIMMs, as no intermediate memory capacities between 16 and 32 GB would be available. Thus, the second system would generally only have a total memory capacity of 32 GB per channel, which is less than the first system. However, due to examples, the second system may be able to instead support two 24 GB LRDIMMs via non-binary rank multiplication, for a total memory capacity of 48 GB per channel, which is equal to the second system.

Referring now to the drawings, FIG. 1 is an example block diagram of a system 100 to repurpose a chip select input to an address input. The system 100 may interface with, be included in, or include any type of device including a memory and/or a controller, such as a DRAM, a LRDIMM, a memory controller, a memory module, a notebook computer, a desktop computer, an all-in-one system, a server, a network device, a wireless device, a storage device, a mobile device, a thin client, a retail point of sale device, a gaming device, a scientific instrument, and the like.

In FIG. 1, the system 100 is shown to include a repurpose unit 110 and a select unit 120. The repurpose and select units 110 and 120 may include, for example, a hardware device including electronic circuitry for implementing the functionality described below, such as control logic and/or memory. In addition or as an alternative, the repurpose and select units 110 and 120 may be implemented as a series of instructions encoded on a machine-readable storage medium and executable by a processor.

The repurpose unit 110 may repurpose one of a plurality of chip select inputs of a LRDIMM to an address input of the LRDIMM. The select unit 120 may select one of a plurality of memory ranks (not shown) of the LRDIMM based on a remainder of the plurality of the chip select inputs. The repurposed chip select input may be used to support non-binary rank multiplication of the LRDIMM. For example, the repurposed chip select input may be used to support at least one of 3×, 5×, 6× and 7× rank multiplication of the LRDIMM. In turn, the LRDIMM may support at least one of 6, 10, 12 and 14 memory ranks. The repurpose unit 110, the select unit 120 and the repurposed chip select input will be explained in greater detail below with respect to FIG. 2.

Figure 2:
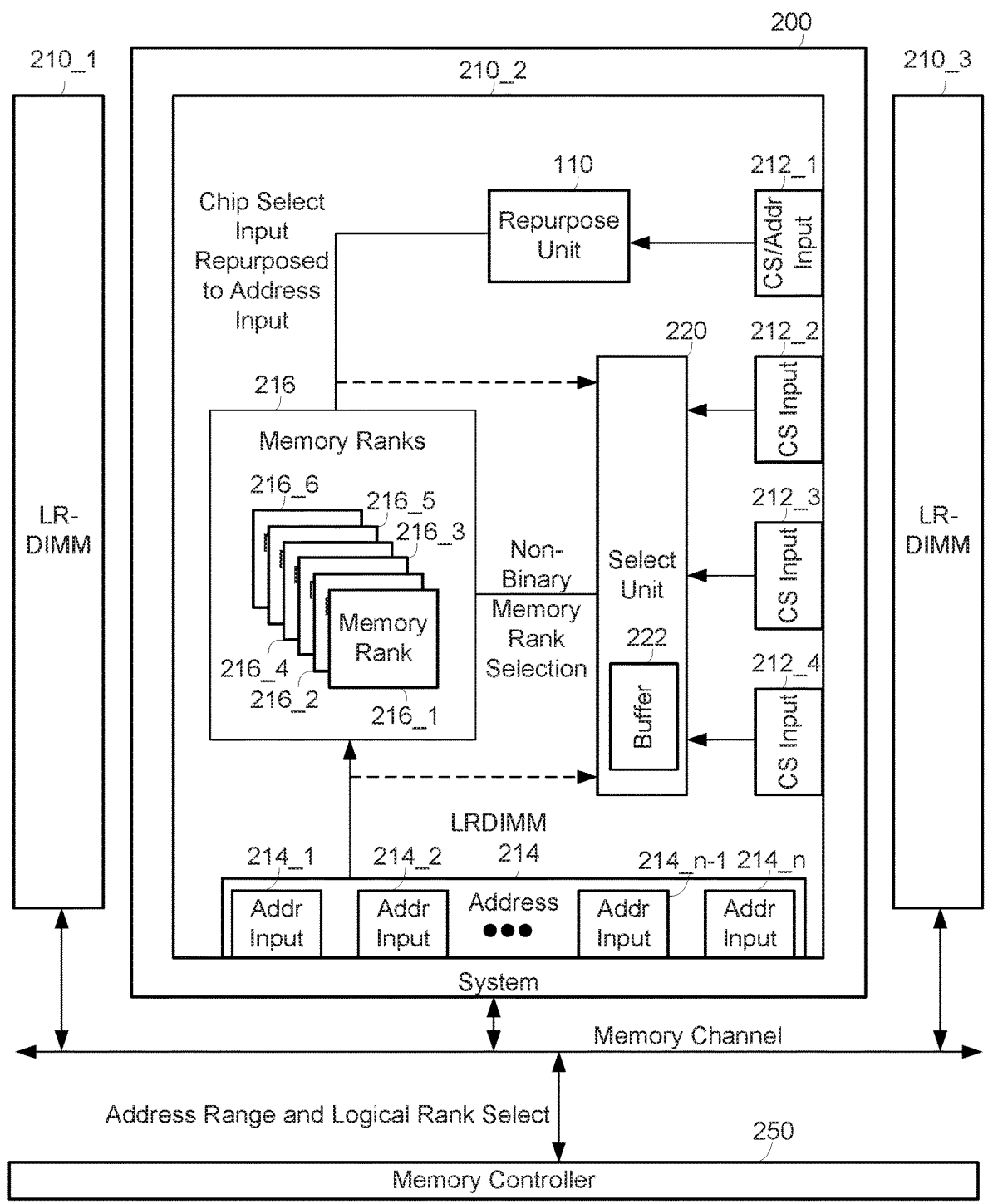
FIG. 2 is another example block diagram of a system to repurpose a chip select input to an address input.

FIG. 2 is another example block diagram of a system 200 to repurpose a chip select input to an address input. The system 200 may interface with, be included in, or include any type of device including a memory and/or a controller, such as a DRAM, a LRDIMM, a memory controller, a memory module, a notebook computer, a desktop computer, an all-in-one system, a server, a network device, a wireless device, a storage device, a mobile device, a thin client, a retail point of sale device, a gaming device, a scientific instrument, and the like.

Here, three LRDIMMs 210_1 to 210_3 are shown along a single memory channel, such as of a server. Yet examples may include more or less than three LDRIMMs, such as one or two LRDIMMs. A memory controller 250 interfaces with the three LRDIMMs 210_1 to 210_3 via the memory channel. The system 200 is shown to only include the second LRDIMM 210_2. However, examples of the system 200 may include more than one of the LRDIMMs 210_1 to 210_3 or be included in one of the LRDIMMs 210_1 to 210_3. While the functionality and/or hardware of the second LRDIMM 210_2 is described below, the first and third LRDIMMs 210_1 and 210_3 may include similar functionality and/or hardware.

The second LRDIMM 210_2 is shown to include the repurpose unit 110, a select unit 220, a plurality of chip select inputs 212_1 to 212_4, a plurality of address inputs 214_1 to 214_n (where n is a natural number) and a plurality of memory ranks 216_1 to 216_6. While FIG. 2 shows four chip select inputs 212_1 to 212_4, examples may include more or less than four chip select inputs 212_1 to 212_4. Similarly, while FIG. 2 shows six memory ranks 216_1 to 216_6, examples may include more or less than six memory ranks 216_1 to 216_6, such as 2, 4, 6, 10, 12 or 14 memory ranks. The system 200 of FIG. 2 may include the functionality and/or hardware of the system 100 of FIG. 1. For example, the second LRDIMM 210_2 includes the repurpose unit 110 of FIG. 1. Further, the select unit 220 of FIG. 2 includes at least the functionality and/or hardware of the select unit 120 of FIG. 1.

The plurality of chip select inputs 212_1 to 212_4 and plurality of address inputs 214_1 to 214_n of the second LRDIMM 210_2 may be interfaces to receive information from the memory controller 250 via the memory channel. For example, each of the plurality of chip select inputs 212_1 to 212_4 and each of the plurality of address inputs 214_1 to 214_n may be separate physical pins, with the plurality of chip select inputs 212_1 to 212_4 to receive a chip or logical rank selection and the plurality of address inputs 214_1 to 214_n to receive an address range, from the memory controller 250.

The memory ranks 216_1 to 216_6 may be any electronic, magnetic, optical, or other physical storage device(s), such as Random Access Memory (RAM) like synchronous dynamic random-access memory (SDRAM), dynamic random access memory (DRAM), or graphics RAM. For example, each of the memory ranks 216_1 to 216_6 may represent separate physical DRAMs and/or separate logical partitions between one or more DRAMs.

In addition, the memory ranks 216 may have a DDR interface. The DDR interface may allow the memory ranks 216 to transfer data on both rising and falling edges of a clock signal along a bus, such as the memory channel. The DDR interface may include any generation of DDR, such as DDR first generation (DDR1) through DDR fourth generation (DDR4).

As explained above, each of the LRDIMMs 210_1 to 210_3 may present two logical ranks to the memory controller 250. The memory controller 250 may select one of the plurality of logical ranks via the plurality of chip select inputs 212_1 to 212_4. Here, the memory controller 250 may select one of six logical ranks. For example, first and second logical ranks may correspond to the first LRDIMM 210_1, third and fourth logical ranks may correspond to the second LRDIMM 210_2, and fifth and sixth logical ranks may correspond to the third LRDIMM 210_3. Further, the memory controller 250 may output an address range in parallel to all of the LRDIMMs 210_1 to 210_3 via the plurality of address inputs 214_1 to 214_n. The memory controller 250 may provide a different address range for each of the selected logical ranks, in order to correlate the address range to one of the LRDIMMs 210_1 to 210_3.

As explained above, the repurpose unit 110 may repurpose one of a plurality of chip select inputs 212 to an address input 214 of the second LRDIMM 210_2. Here, the repurpose unit 110 is shown to reroute the first chip select input 212_1 to the memory ranks 216, instead of the select unit 220, in order to repurpose the first chip select input 212_1 to an address input 214. For example, each of the plurality of address inputs 214_1 to 214_n may relate to a separate bit of an address 214. The repurposed chip select input 212_1 may add an additional bit to the address 214, such as the most significant bit. In turn, this may allow for a greater range of addresses, which may allow for greater rank multiplication and/or storage capacity, such as by allowing for doubling of the ranks or storage capacity. The address 214 may relate to a row and/or column address space, as defined by the DDR interface.

The select unit 120 may select one of the plurality of memory ranks 216_1 to 216_6 of the second LRDIMM 210_2 based on the three remaining chip select inputs 212_2 to 212_4 as well as at least one of the address inputs 214_1 to 214_n, which may include the repurposed chip select input 212_1. For example, the selection unit 220 may include a memory buffer 222.

As explained above, the memory buffer 222 may act as an intermediary by mapping one of the six logical ranks indicated by the memory controller 250 to one of six memory ranks 216_1 to 216_6 of the second LRDIMM 210_2, assuming one of the two logical ranks of the second LRDIMM 210_2 is selected by the memory controller 250. This mapping may be done based on both the chip select inputs 212_2 to 212_4 and at least a portion of the address range asserted by the memory controller for a given memory operation, such as the most or least significant address bit 214_1 or 214_n.

In some cases, the buffer 222 may be set to a binary rank multiplication number greater than a non-binary rank multiplication supported by the second LRDIMM 210_2. The select unit 220 may route any memory ranks indicated by the buffer 222 that are not included in the second LRDIMM 210_2 to one of the existing memory ranks 216 of the second LRDIMM 210_2.

For example, the buffer 222 may assume quad-rank multiplication or eight memory ranks. However, the second LRDIMM 210_2 may only include six memory ranks 216_1 to 216_6 and thus allow only for 3× rank multiplication. In this case, at least two of the eight memory ranks indicated by the buffer 222 may be routed to one of the existing six memory ranks 216_1 to 216_6.

The memory buffer 222 may also reduce a load on a bus, such as the memory channel. For example, the memory buffer 222 may reduce each clock, command and address and data input to a single load, which may increase the memory speed. Thus, as shown above, the repurposed chip select input 212_1 may be used to support non-binary rank multiplication of the LRDIMM. For example, the repurposed chip select input may be used to support at least one of 3×, 5×, 6× and 7× rank multiplication of the LRDIMM. In turn, the LRDIMM may support at least one of 6, 10, 12 and 14 memory ranks.

Figure 3:
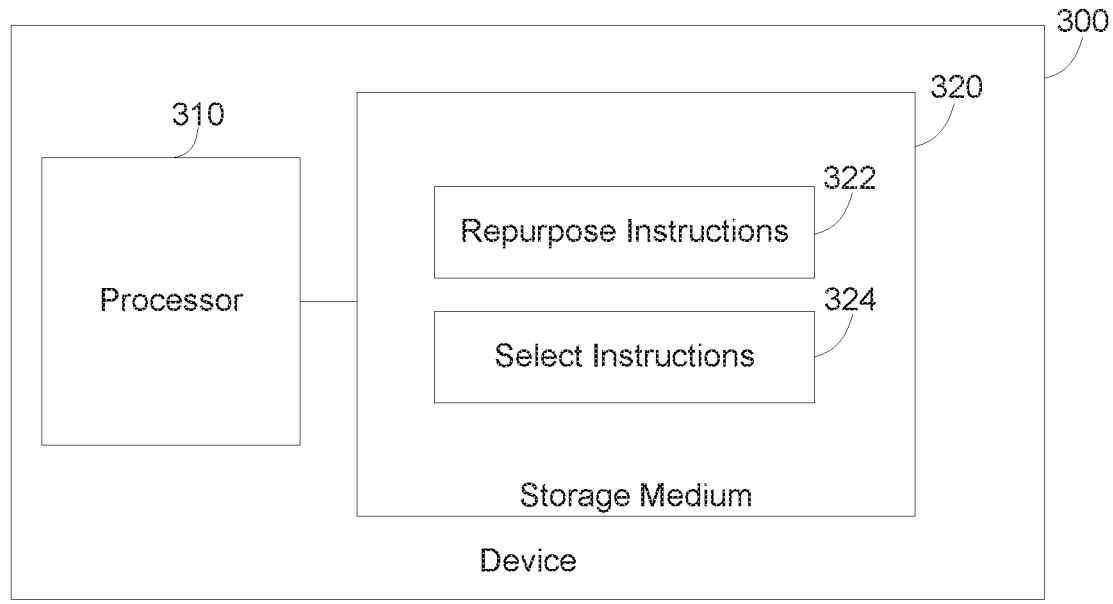
FIG. 3 is an example block diagram of a computing device including instructions for repurposing a chip select input to an address input.

FIG. 3 is an example block diagram of a computing device 300 including instructions for repurposing a chip select input to an address input. In the embodiment of FIG. 3, the computing device 300 includes a processor 310 and a machine-readable storage medium 320. The machine-readable storage medium 320 further includes instructions 322 and 324 for repurposing a chip select input to an address input.

The computing device 300 may be included in or part of, for example, a microprocessor, a controller such as a memory controller, a memory module or device, a notebook computer, a desktop computer, an all-in-one system, a server, a network device, a wireless device, or any other type of device capable of executing the instructions 322 and 324. In certain examples, the computing device 300 may include or be connected to additional components such as memories, controllers, etc.

The processor 310 may be, at least one central processing unit (CPU), at least one semiconductor-based microprocessor, at least one graphics processing unit (GPU), a microcontroller, special purpose logic hardware controlled by microcode or other hardware devices suitable for retrieval and execution of instructions stored in the machine-readable storage medium 320, or combinations thereof. The processor 310 may fetch, decode, and execute instructions 322 and 324 to implement repurposing the chip select input to the address input. As an alternative or in addition to retrieving and executing instructions, the processor 310 may include at least one integrated circuit (IC), other control logic, other electronic circuits, or combinations thereof that include a number of electronic components for performing the functionality of instructions 322 and 324.

The machine-readable storage medium 320 may be any electronic, magnetic, optical, or other physical storage device that contains or stores executable instructions. Thus, the machine-readable storage medium 320 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 320 can be non-transitory. As described in detail below, machine-readable storage medium 320 may be encoded with a series of executable instructions for repurposing the chip select input to the address input.

Figure 4:
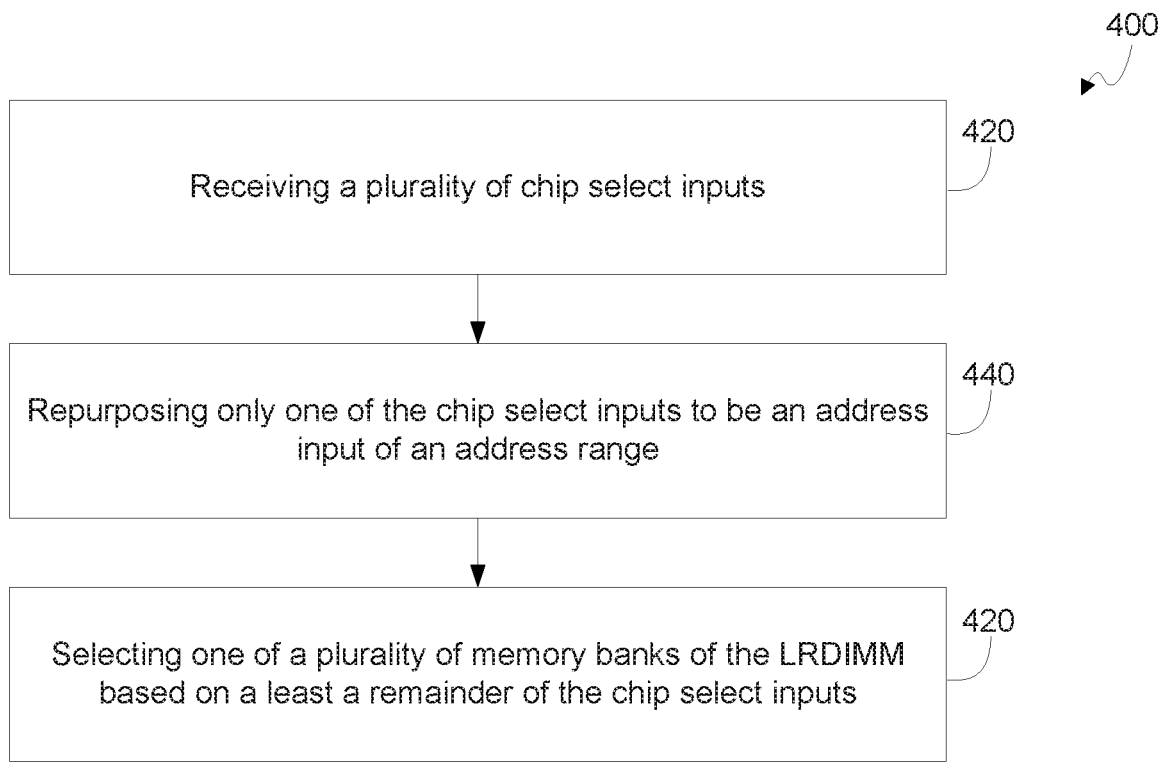
FIG. 4 is an example flowchart of a method for repurposing a chip select input to an address input.

Moreover, the instructions 322 and 324 when executed by a processor (e.g., via one processing element or multiple processing elements of the processor) can cause the processor to perform processes, such as, the process of FIG. 4. For example, the repurpose instructions 322 may be executed by the processor 310 to repurpose one of a plurality of chip select inputs (not shown) to be one of a plurality of address inputs (not shown) at a LRDIMM (not shown). The select instructions 324 may be executed by the processor 310 to select one of a plurality of memory ranks of the LRDIMM based on the plurality of chip select inputs and at least one of the plurality of address inputs. The repurposed chip select input may be used to support non-binary rank multiplication of the LRDIMM.

For example, the non-binary rank multiplication of the LRDIMM may include at least one of 3×, 5×, 6× and 7× rank multiplication. Thus, the LRDIMM may support at least one of 6, 10, 12 and 14 memory ranks. In operation, a buffer (not shown) of the LRDIMM may be set to a binary rank multiplication number greater than a non-binary rank multiplication supported by the LRDIMM. Then, a memory rank indicated by the buffer that is not included in the LRDIMM may be considered invalid and/or routed to one of the existing memory ranks of the LRDIMM.

FIG. 4 is an example flowchart of a method 400 for repurposing a chip select input to an address input. Although execution of the method 400 is described below with reference to the system 100, other suitable components for execution of the method 400 can be utilized, such as the system 200. Additionally, the components for executing the method 400 may be spread among multiple devices or systems (e.g., a processing device in communication with input and output devices). In certain scenarios, multiple devices or systems acting in coordination can be considered a single device or system to perform the method 400. The method 400 may be implemented in the form of executable instructions stored on a machine-readable storage medium, such as storage medium 320, and/or in the form of electronic circuitry.

At block 410, the system 100 receives a plurality of chip select inputs. Then, at block 420, the system 100 repurposes only one of the chip select inputs to be an address input of an address range. The address range may include a plurality of address inputs, each address input to be a bit of the address range. The repurposed chip select input may be repurposed to be a most significant bit of the address range.

Lastly, at block 430, the system 100 selects one of a plurality of memory ranks of the LRDIMM based on a least a remainder of the chip select inputs. The selecting at block 430 may further include selecting one of the plurality of memory ranks of the LRDIMM also based on at least a portion of the address range. The repurposed chip select input may be used to support non-binary rank multiplication of the LRDIMM. The non-binary rank multiplication of the LRDIMM may include at least one of 3×, 5×, 6× and 7× rank multiplication. Thus, the LRDIMM may support at least one of 6, 10, 12 and 14 memory ranks.

A memory controller may output the address range to the LRDIMM and output a chip selection via the plurality of chip select inputs. The chip selection may select one of two logical ranks viewable by the memory controller at the LRDIMM. The selecting at block 430 may convert the selected logical rank to one of the plurality of memory ranks.

I claim:

1. A system, comprising:
   a memory controller;
   a processor;
   a non-transitory computer readable medium including instructions executable by the processor to repurpose a chip select input of a plurality of chip select inputs of a load-reduced dual inline memory module (LRDIMM) to an address input, and reroute the address input of the repurposed chip select input to a plurality of memory ranks of the LRDIMM to support non-binary rank multiplication of the LRDIMM, wherein the LRDIMM is to present a number of logical ranks to the memory controller, and the non-binary rank multiplication comprises the non-binary rank multiplication of the number of logical ranks to provide the plurality of memory ranks of the LRDIMM; and
   a buffer to map a selected logical rank of the number of logical ranks as selected by the memory controller using the plurality of chip select inputs, to a selected memory rank of the plurality of memory ranks, the selected memory rank selected based on selection using an address provided by the memory controller and a remainder of the plurality of chip select inputs other than the repurposed chip select input, wherein the buffer is to be set to a binary rank multiplication number greater than a non-binary rank multiplication supported by the LRDIMM and larger than a number of the plurality of memory ranks of the LRDIMM, wherein the non-binary rank multiplication is associated with a non-binary rank number of the plurality of memory ranks.

2. The system of claim 1, wherein,
   the LRDIMM includes a plurality of address inputs, and
   the instructions are to select the selected memory rank of the plurality of memory ranks of the LRDIMM based on at least one of the plurality of address inputs.

3. The system of claim 2, wherein,
   each of the plurality of address inputs relates to a separate bit of an address, and
   the repurposed chip select input adds a most significant bit to the address of the plurality of address inputs.

4. The system of claim 3, further comprising:
   a plurality of LRDIMMs per channel; and
   each of the plurality of LRDIMMs is to present multiple logical ranks to the memory controller, and
   the memory controller is to provide a different address range for each of the logical ranks that are selected.

5. The system of claim 1, wherein the LRDIMM includes a double data rate (DDR) memory.

6. The system of claim 1, wherein,
   the instructions are to route a memory rank indicated by the buffer that is not included in the LRDIMM to one of the plurality of memory ranks of the LRDIMM.

7. The system of claim 1, wherein the non-binary rank multiplication comprises one of 3×, 5×, 6× or 7× rank multiplication, and wherein the LRDIMM is to support one of 6, 10, 12, or 14 memory ranks.

8. A method, comprising:
   receiving, at a load-reduced dual inline memory module (LRDIMM), a plurality of chip select inputs from a memory controller, wherein the LRDIMM is to present a number of logical ranks to the memory controller;
   repurposing, at the LRDIMM, a chip select input of the plurality of chip select inputs to be an address input of an address range, wherein the address input of the repurposed chip select input is rerouted to a plurality of memory ranks of the LRDIMM, the repurposed chip select input supporting non-binary rank multiplication of the LRDIMM, and the non-binary rank multiplication comprises the non-binary rank multiplication of the number of logical ranks to produce a quantity of the plurality of memory ranks of the LRDIMM; and
   selecting a selected memory rank of the plurality of memory ranks based on a remainder of the chip select inputs other than the repurposed chip select input, the selecting comprising mapping, using a buffer, a selected logical rank of the number of logical ranks as selected by the memory controller using the plurality of chip select inputs, to the selected memory rank of the plurality of memory ranks, wherein the buffer is set to a binary rank multiplication number greater than the non-binary rank multiplication supported by the LRDIMM and larger than the quantity of the plurality of memory ranks of the LRDIMM, wherein the non-binary rank multiplication is associated with a non-binary rank number of the plurality of memory ranks.

9. The method of claim 8, wherein the selecting further includes selecting the selected memory rank further based on at least a portion of the address range.

10. The method of claim 9, wherein,
    the address range is based on a plurality of address inputs, each address input being a bit of the address range, and
    the repurposed chip select input is repurposed to be a most significant bit of the address range.

11. The method of claim 9, wherein,
    the memory controller is to output the address range to the LRDIMM and to output a chip selection via the plurality of chip select inputs, the chip selection to select the selected logical rank of the number of logical ranks viewable by the memory controller at the LRDIMM.

12. The method of claim 8, wherein,
    the non-binary rank multiplication includes one of 3×, 5×, 6×, or 7× rank multiplication, and
    the LRDIMM is to support one of 6, 10, 12, or 14 memory ranks.

13. A system comprising:
a memory controller; and
a load-reduced dual inline memory module (LRDIMM) comprising a processor to:
repurpose a chip select input of a plurality of chip select inputs to be an address input of a plurality of address inputs at the LRDIMM, wherein the LRDIMM is to present a number of logical ranks to the memory controller, the repurposed chip select input supporting non-binary rank multiplication of the LRDIMM, and the non-binary rank multiplication comprises the non-binary rank multiplication of the number of logical ranks to produce a quantity of a plurality of memory ranks of the LRDIMM; and
select a selected memory rank of the plurality of memory ranks of the LRDIMM based on the plurality of chip select inputs, the LRDIMM comprising a buffer to map a selected logical rank of the number of logical ranks as selected by the memory controller using the plurality of chip select inputs, to the selected memory rank of the plurality of memory ranks, wherein the buffer is set to a binary rank multiplication number of a buffer to be greater than the non-binary rank multiplication supported by the LRDIMM and larger than the quantity of the plurality of memory ranks of the LRDIMM, wherein the non-binary rank multiplication is associated with a non-binary rank number of the plurality of memory ranks.

14. The system of claim 13, wherein:
the non-binary rank multiplication includes one of 3×, 5×, 6×, or 7× rank multiplication, and
the LRDIMM is to support one of 6, 10, 12, or 14 memory ranks.

15. The system of claim 13, wherein the LRDIMM is to route a memory rank indicated by the buffer that is not included in the LRDIMM to one of the plurality of memory ranks of the LRDIMM.

16. The system of claim 13, wherein,
each of the plurality of address inputs relates to a separate bit of an address, and
the repurposed chip select input is to add a most significant bit to the address.

17. The system of claim 1, comprising the LRDIMM, wherein the processor, the non-transitory computer readable medium, and the buffer are part of the LRDIMM.

18. The method of claim 8, further comprising:
routing a memory rank indicated by the buffer that is not included in the LRDIMM to one of the plurality of memory ranks of the LRDIMM.

19. The method of claim 8, wherein each of a plurality of LRDIMMs is to present multiple logical ranks to the memory controller, and the memory controller selects a logical rank of one of the plurality of LRDIMMs.

* * * * *